(12) United States Patent
Sun et al.

(10) Patent No.: US 11,714,402 B2
(45) Date of Patent: Aug. 1, 2023

(54) UNIVERSAL AUTOMATIC TEST SYSTEM FOR DIGITAL PLUGBOARD BASED ON IMAGINE PROCESSING

(71) Applicant: 38TH RESEARCH INSTITUTE, CHINA ELECTRONICS TECHNOLOGY GROUP CORPORATION, Hefei (CN)

(72) Inventors: Guoqiang Sun, Hefei (CN); Fangning Tian, Hefei (CN); Wenqing Tong, Hefei (CN); Yifeng Bai, Hefei (CN); Fengtao Shu, Hefei (CN); Jianjun Su, Hefei (CN)

(73) Assignee: 38TH RESEARCH INSTITUTE, CHINA ELECTRONICS TECHNOLOGY GROUP CORPORATION, Hefei (CN)

( * ) Notice: Subject to any disclaimer, the term of this patent is extended or adjusted under 35 U.S.C. 154(b) by 0 days.

(21) Appl. No.: 17/889,672

(22) Filed: Aug. 17, 2022

(65) Prior Publication Data

US 2022/0390932 A1    Dec. 8, 2022

Related U.S. Application Data

(63) Continuation of application No. PCT/CN2022/078821, filed on Mar. 2, 2022.

(30) Foreign Application Priority Data

Sep. 29, 2021 (CN) .......................... 202111153906.3

(51) Int. Cl.
*G01R 31/34* (2020.01)
*G05B 23/02* (2006.01)

(52) U.S. Cl.
CPC ............ *G05B 23/02* (2013.01); *G01R 31/34* (2013.01)

(58) Field of Classification Search
CPC .... G01R 31/34; G01R 31/2834; G05B 23/02; G05B 23/0283; G05B 23/0256
See application file for complete search history.

(56) References Cited

U.S. PATENT DOCUMENTS

| | | | |
|---|---|---|---|
| 5,369,431 A * | 11/1994 | Levy | G01R 31/2808 348/126 |
| 5,428,548 A | 6/1995 | Pilborough et al. | |
| 9,223,683 B1 | 12/2015 | Knych | |

FOREIGN PATENT DOCUMENTS

| | | |
|---|---|---|
| CN | 102092477 A | 6/2011 |
| CN | 104914346 A | 9/2015 |
| CN | 105389805 A | 3/2016 |

(Continued)

*Primary Examiner* — Toan M Le

(57) ABSTRACT

A universal automatic test system for a digital plugboard based on imagine processing, includes a digital plugboard test platform, an image acquisition and processing module, a test instrument module and a control and processing module. The universal automatic test system can determine a type of the digital plugboard and a point to be test based on the image of the digital plugboard, and call a corresponding automatic test program to complete the test of each point. A type of the output signal can be obtained through the universal automatic test system. By moving the detection probe, the any position of the digital plugboard can be test, and a fault portion of the digital plugboard can be obtained according to the test result.

1 Claim, 5 Drawing Sheets

(56) References Cited

FOREIGN PATENT DOCUMENTS

| | | | |
|---|---|---|---|
| CN | 106019039 | A | 10/2016 |
| CN | 110261807 | A | 9/2019 |
| CN | 110837036 | A | 2/2020 |
| CN | 110940315 | A | 3/2020 |
| CN | 210514469 | U | 5/2020 |
| CN | 111652095 | A | 9/2020 |
| CN | 213091818 | U | 4/2021 |
| CN | 113447792 | A | 9/2021 |
| CN | 113759200 | A | 12/2021 |
| WO | 2008135664 | A1 | 11/2008 |

* cited by examiner

UNIVERSAL AUTOMATIC TEST SYSTEM FOR DIGITAL PLUGBOARD BASED ON IMAGINE PROCESSING

CROSS-REFERENCE TO RELATED APPLICATIONS

This application is a continuation of International Patent Application No. PCT/CN2022/078821, filed on Mar. 2, 2022, which claims the benefit of priority from Chinese Patent Application No. 202111153906.3, filed on Sep. 29, 2021. The content of the aforementioned applications, including any intervening amendments thereto, is incorporated herein by reference in its entirety.

TECHNICAL FIELD

The present disclosure relates to digital plugboard test techniques, and more particularly to a universal automatic test system for a digital plugboard based on imagine processing.

BACKGROUND

The development of technology contributes to a development of electronic products, which use more and more varieties and numbers of digital circuits. Different electronic devices result in different functions and indicators of digital circuits. Currently, functional performance test and troubleshooting of the digital circuits are performed manually, which requires a thorough understanding of the specific circuit and functional performance specifications of digital plugboard. Therefore, one person can only be responsible for a measurement of one or several certain digital circuits.

For long-life radars having at least 20 years duration, there are many types of radars, and small production of each type. Every type of radars uses different digital plugboard. Thus, manual test is labor-consuming. Even after the production is discontinued, some technicists are still required to maintain and test the digital plugboard to guarantee a normal use. The manual test has low efficiency, and is time-consuming and technique-requiring. In consequence, more radar types lead to more labor occupation and heavier burden on the company.

It is predictable that the digital plugboard in indicators testing and fault diagnosis will be gradually automated and intelligent. Chinese patent application publication No. 201510229128.X, titled "non-principal test device for a digital plugboard and test method thereof", generates a test vector signal through a test system, and compares the generated test vector signal with a received test vector signal to determine faults such as short circuits and open circuits in a signal transmission channel. Whereas, most circuit boards not only need to ensure a signal connectivity, but also need to process the signal, in which an output signal is different from an input signal. This patent only compares an amplitude of the test signal, not a type of signal. Moreover, it can only locate an approximate location of a breakpoint or pseudo solder joint in a passage. Accordingly, a universal automatic test system for a digital plugboard based on imagine processing is provided.

SUMMARY

In order to satisfy automatic testing requirements of different varieties of digital plugboards, to reduce demand for technicists for test, and to improve test efficiency, this disclosure provides a universal automatic test system for a digital plugboard based on imagine processing.

Technical solutions of this application are described as follows.

A universal automatic test system for a digital plugboard based on imagine processing, comprising:
 a digital plugboard test platform;
 an image acquisition and processing module;
 a test instrument module; and
 a control and processing module;
 wherein the digital plugboard test platform is configured to fix a digital plugboard and link the digital plugboard to a task, connect an external port of the digital plugboard to the test instrument module to allow the digital plugboard to generate an output signal according to a test signal;
 the image acquisition and processing module is configured to acquire an image of the digital plugboard and extract a layout feature of a chip and component of the digital plugboard, compare the layout feature with a feature data stored in a database, identify a type of the digital plugboard, and output an identification result to the control and processing module;
 the test instrument module is configured to generate the test signal under control of the control and processing module, collect the output signal from the digital plugboard, and transmit the test signal and the output signal to the control and processing module; and
 the control and processing module is configured to control a test for the digital plugboard, determine whether the digital plugboard is in normal state or in fault state, and provide a fault portion and a maintenance plan.

In some embodiments, the digital plugboard test platform comprises a three-dimensional (3D) screw rod module, a control box, a platform, a signal transfer unit, a fixing clamp and a detection probe; the 3D screw rod module is configured to drive the detection probe to move in an X-axis direction, a Y-axis direction and a Z-axis direction to enable the detection probe to contact with any position of the digital plugboard; the control box is configured to drive the 3D screw rod module to move under control of the control and processing module; the fixing clamp is arranged at the platform; a size of the fixing clamp is capable of being adjusted according to a size of the digital plugboard to fix the digital plugboard; an end of the detection probe is capable of connecting to a test point of the digital plugboard; the other end of the detection probe is connected to the test instrument module; the signal transfer unit is a test port, and is arranged at the platform; an end of the test port is communicatively connected to the external port of the digital plugboard; and the other end of the test port is communicatively connected to the test instrument module.

In some embodiments, the image acquisition and processing module comprises an image acquisition unit, an image processing unit, a feature extraction unit and a determining unit sequentially connected; the image acquisition unit is configured to acquire the image of the digital plugboard; the image processing unit is configured to preprocess the image of the digital plugboard; the feature extraction unit is configured to extract the layout feature of the chip and component of the digital plugboard and compare with the feature data stored in the database to obtain a feature parameter of the digital plugboard; and the determining unit is configured to compare the feature parameter of the digital plugboard with the feature data stored in the database to determine the type of the digital plugboard.

In some embodiments, the image acquisition unit comprises a camera and a light source; the light source is configured to allow the digital plugboard in a well-lit environment; the camera is configured to acquire the image of the digital plugboard and transmit the image of the digital plugboard to the image processing unit.

In some embodiments, the control and processing module comprises a test control unit, a determining unit and a human-machine interaction unit sequentially connected; the test control unit is configured to control a movement of the detection probe, allow a test instrument to generate the test signal and to acquire the output signal of the digital plugboard, and receive the identification result; the determining unit is configured to determine a state of the test instrument according to an output data of the universal automatic test system, and determine whether the digital plugboard is in normal state or in fault state according to a collected data of the test instrument; if in fault state, the determining unit is configured to evaluate the fault portion according to a data of each portion, and provide the maintenance plan; and the human-machine interaction unit is configured to control the universal automatic test system and output a test result, control the universal automatic test system to be on or off, and output or print the test result.

In some embodiments, the test instrument module comprises a power supply, a signal generator and a signal collector; the power supply is configured to provide a power signal for the digital plugboard; the signal generator is configured to provide the test signal for the digital plugboard; the signal collector is configured to collect the output signal of the digital plugboard through the detection probe and the test port, and transmit the output signal to the control and processing module.

A test method of the above-mentioned universal automatic test system to the digital plugboard based on image processing, comprising:

(S1) connecting the digital plugboard to the test port; determining whether the test port matches the digital plugboard; and if not, adapting, by an adapter, the digital plugboard and the test port;

(S2) starting an automatic test by clicking a start button on the universal automatic test system;

(S3) turning on, the light source of the image acquisition unit under control of the control and processing module; and acquiring, by the camera of the image acquisition unit, the image;

(S4) processing the image; extracting a key feature of the image; and determining the type of the digital plugboard;

(S5) generating, by the power supply and the signal generator of the test instrument module, a direct current (DC) power and the test signal needed by the digital plugboard;

(S6) collecting, by the signal collector, the output signal from the test port output by the digital plugboard;

(S7) analyzing, by the control and processing module, the output signal; determining whether the output signal has a preset signal amplitude and signal pattern; and if there are a plurality of unqualified output signals, sequentially extracting a transmission link of each of the plurality of unqualified output signals and a corresponding test point thereof from the database; and (S8) sequentially collecting, by the detection probe, the test point of the transmission link of each of the plurality of unqualified output signals; analyzing, by the control and processing module, the plurality of unqualified output signals; determining whether the plurality of unqualified output signals satisfies a preset signal amplitude and signal pattern; and locating a fault point.

Compared to the prior art, this application has the following beneficial effects.

The universal automatic test system can determine a type of the digital plugboard and a point to be test based on the image of the digital plugboard, and call a corresponding automatic test program to complete the test of each point. A type of the output signal can be obtained through the universal automatic test system. By moving the detection probe, the any position of the digital plugboard can be test, and a fault portion of the digital plugboard can be obtained according to the test result, assisting users to maintain, which is worth to be promoted.

DETAILED DESCRIPTION OF EMBODIMENTS

The embodiments of this application will be described in detail below, and it should be understood that these embodiments are not intended to limit the scope of the disclosure.

Embodiment 1

Provided herein is a universal automatic test system for a digital plugboard based on imagine processing, including a digital plugboard test platform, an image acquisition and processing module, a test instrument module and a control and processing module. An image of the digital plugboard is acquired to extract a layout feature of a chip and component of the digital plugboard. The layout feature is compared with a feature data stored in a database to identify a type of the digital plugboard. Under control of the control and processing module, an automatic test program is called to control a detection probe and a test instrument to complete a test. A test data is compared with a standard data to determine a fault portion. The test data, the standard data, an identification result, the fault portion and a maintenance plan are output to a human-machine interaction unit to assist the test and maintenance of the digital plugboard.

In an embodiment, the digital plugboard test platform can fix the digital plugboard and link the digital plugboard to a task, and connect an external port of the digital plugboard to the test instrument module to allow the digital plugboard to generate an output signal according to a test signal.

In an embodiment, the image acquisition and processing module can acquire an image of the digital plugboard and extract a layout feature of a chip and component of the digital plugboard, compare the layout feature with a feature data stored in a database, identify a type of the digital plugboard, and output an identification result to the control and processing module.

In an embodiment, the control and processing module can call a corresponding automatic test program according to the identification result. The test instrument, under control of the control and processing module, generates the test signal according to the automatic test program, and transmit to the digital plugboard. The test instrument acquires the output signal of the digital plugboard, and records an input and output data of the digital plugboard. The control and processing module can determine whether the digital plugboard is in normal state or in fault state, then provide a fault portion and a maintenance plan. The test result, a state determination result, the fault portion and the maintenance plan are transmitted to the user for reference or storage.

In an embodiment, the test instrument module is under control of the control and processing module, which can generate the test signal needed by the digital plugboard, acquire the output signal of the digital plugboard, and output the test signal and the output signal to the control and processing module.

Embodiment 2

Figure 1:
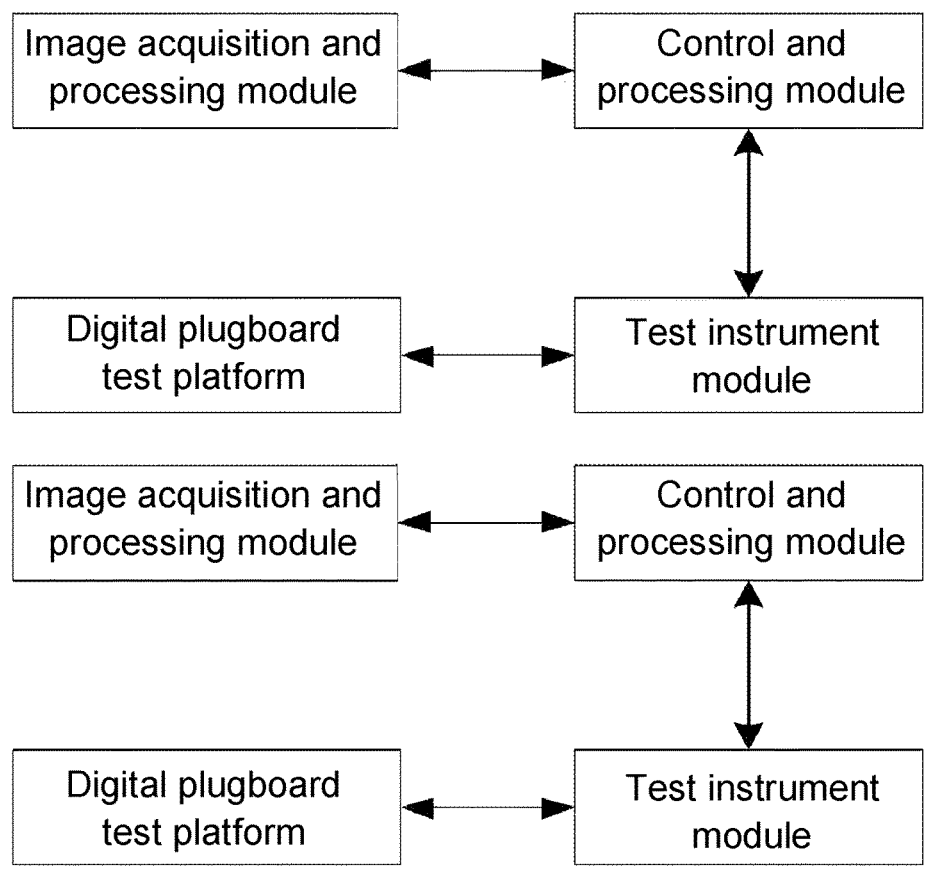
FIG. 1 schematically depicts a universal automatic test system for a digital plugboard according to Embodiment 2 the present disclosure.

Illustrated in FIG. 1 is a universal automatic test system for a digital plugboard based on imagine processing, including: a digital plugboard test platform, an image acquisition and processing module, a test instrument module and a control and processing module. The digital plugboard test platform can fix a digital plugboard and connect the digital plugboard to a task. The image acquisition and processing module can acquire an image of the digital plugboard, extract a layout feature, and identify a type of the digital plugboard. The control and processing module can complete a test of the digital plugboard, determine whether the digital plugboard is in normal state or in fault state, and provide a fault portion and a maintenance plan. The test instrument module can generate the test signal under control of the control and processing module, and collect the output signal of the digital plugboard.

Figure 2:
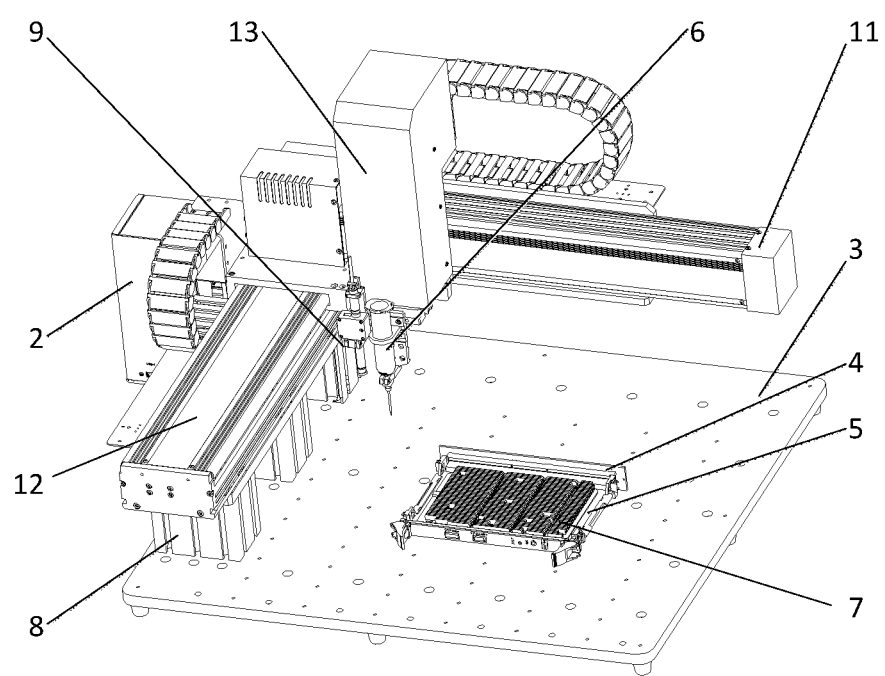
FIG. 2 schematically depicts a structure of a digital plugboard test platform according to Embodiment 2 the present disclosure.

As shown in FIG. 2, the digital plugboard test platform includes a 3D screw rod module, a control box 2, a platform 3, a signal transfer unit 4, a fixing clamp 5, a detection probe 6 and a column 8. The 3D screw rod module includes an X-direction screw rod module 11, a Y-direction screw rod module 12 and a Z-direction screw rod module 13 respectively configured to drive the detection probe to move in an X-axis direction, a Y-axis direction and a Z-axis direction. Each of the screw rod modules includes a screw rod and a motor. The control box 2 drives the motor to operate under control of the control and processing module, so as to drive the detection probe 6 to move along the X-axis direction, the Y-axis direction and the Z-axis direction. Therefore, the detection probe 6 can contact any position of the digital plugboard 7. The fixing clamp 5 can adjust a size thereof according to a size of the digital plugboard 7, so as to fix the digital plugboard 7 during test for convenience. The platform 3 supports the fixing clamp 5 and the 3D screw rod module. The signal transfer unit 4 connects the digital plugboard 7 and the test instrument module. In this embodiment, the signal transfer unit is a test port. The column 8 is arranged at the platform 3 and is connected to the 3D screw rod module and the control box 2. A camera 9 of an image acquisition unit is arranged next to the detection probe 6, thus the detection probe 6 will not affect the camera 9 when retracts. In principle, position of the camera 9 is not limited only if it can take pictures of the digital plugboard 7.

Figure 3:
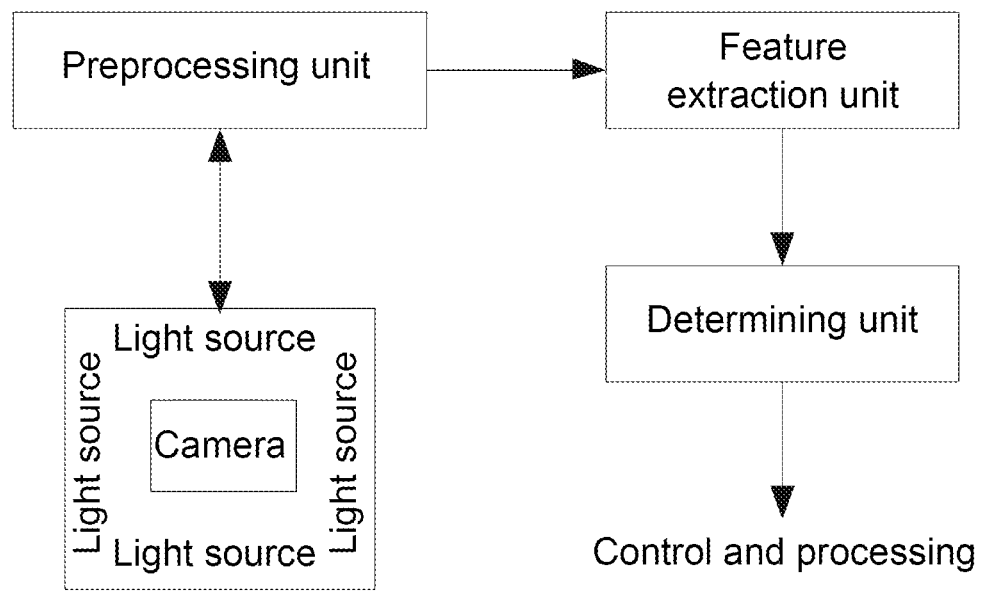
FIG. 3 schematically depicts an image acquisition and processing module according to Embodiment 2 the present disclosure.

As shown in FIG. 3, the image acquisition and processing module includes the image acquisition unit, an image processing unit, a feature extraction unit and a determining unit sequentially connected.

The image acquisition unit includes a high quality camera and a light source. The light source allows the digital plugboard in a well-lit environment, ensuring a high quality image. The high quality camera acquires the image of the digital plugboard and transmits the image of the digital plugboard to the image processing unit.

The image processing unit preprocesses the image of the digital plugboard for feature extraction, including analog to digital (A/D) and noise reduction, protecting the image feature extraction and analysis from a noise. When the acquired image is a digital image, the image can be subjected to noise reduction and normalization without A/D.

The feature extraction unit extracts a key feature, such as position, shape and color, of each component of the digital plugboard, and compares with the feature data stored in the database to obtain a feature parameter of the digital plugboard, facilitating a subsequent test.

The determining unit compares the feature parameter of the digital plugboard with a feature data stored in the database to determine the type of the digital plugboard. For example, sizes and logo fonts of different components are different; or there is a color ring on the resistors. Considering a difference of component type, number and layout of every type of digital plugboard, after identifying the component type, the component layout is taken into consideration to determine the type of the digital plugboard. Compared with other methods in the prior art, the present determination is simple and efficient, which can significantly simple a hardware complexity and improve an accuracy rate.

Figure 4:
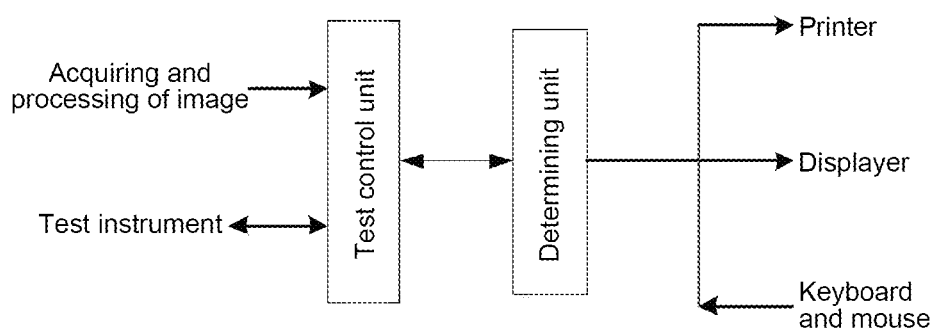
FIG. 4 schematically depicts a control and processing module according to Embodiment 2 the present disclosure.

As shown in FIG. 4, the control and processing module is the key of the universal automatic test system and includes a test control unit, a determining unit and a human-machine interaction unit.

The test control unit controls a movement of the detection probe, and controls the test instrument to generate a test signal and to acquire the output signal of the digital plugboard.

The determining unit determines a state of the test instrument according to an output data of the universal automatic test system, and determines whether the digital plugboard is in normal state or in fault state according to a collected data of the test instrument. If in fault state, the determining unit evaluates a data of each portion to provide a fault portion and the maintenance plan. Specifically, the determining unit compares the collected data of all portions with the standard signal to determine an unqualified signal. According to a preset transmission link, the first fault portion on the preset transmission link is determined, guiding the users to troubleshoot.

The human-machine interaction includes a keyboard, a mouse, a displayer and a printer, and is configured to control the universal automatic test system and output the test result. Specifically, the human-machine interaction controls the universal automatic test system to start or stop, and outputs or prints the test result.

Figure 5:
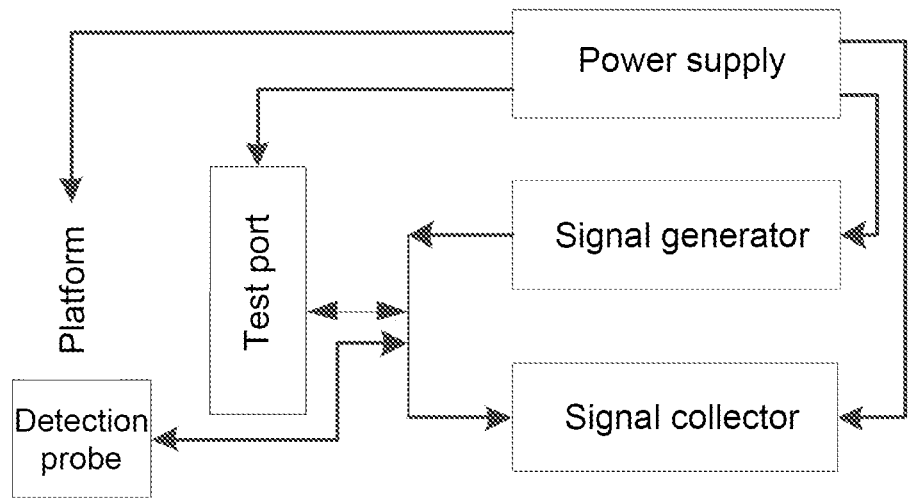
FIG. 5 schematically depicts a test instrument module according to Embodiment 2 the present disclosure.

As shown in FIG. 5, the test instrument module includes a power supply, a signal generator and a signal collector. The power supply can provide a power signal for the digital plugboard, such as DC 15V, 5V and 24V. The signal generator can provide the test signal for the digital plugboard. The signal collector can collect the output signal of the digital plugboard through the detection probe and the test port, and transmit the output signal to the control and processing module. The detection probe and the test port can transmit a signal. The test port has multiple pins to transmit the power, test signal and output signal, respectively. The test port can transmit the power and a digital signal to the digital plugboard, and transmit the output signal of the digital plugboard to the signal collector. The detection probe can transmit a signal of a test position (test point) to the signal collector.

Figure 6:
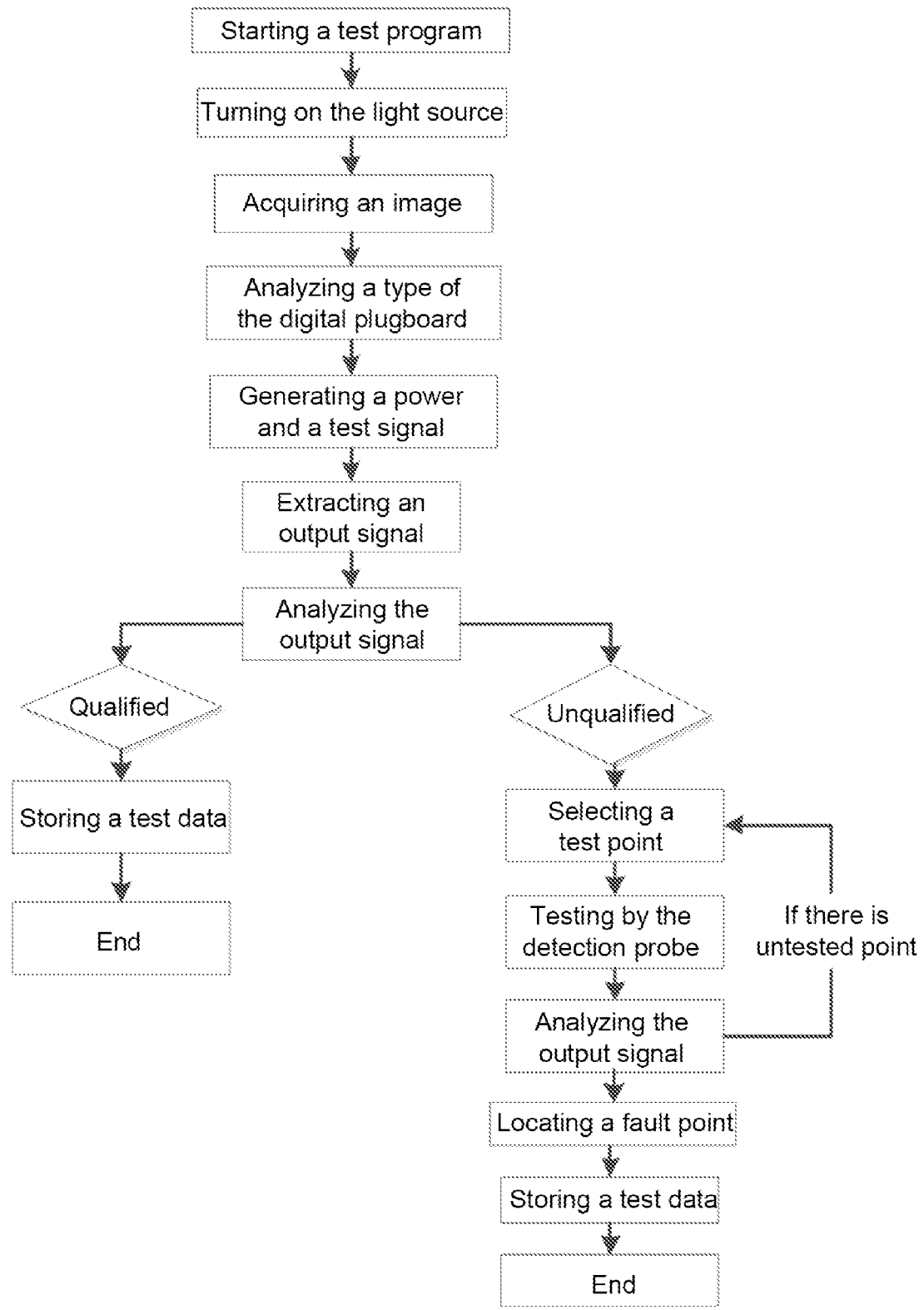
FIG. 6 is a flow chart of a test of the digital plugboard according to Embodiment 2 the present disclosure.

Illustrated in FIG. 6 is a test method of the universal automatic test system to the digital plugboard, including the following steps.

(S1) The digital plugboard is connected to the test port. Whether the test port matches the digital plugboard is determined. If not match, the digital plugboard and the test port are adapted through an adapter.

(S2) A start button on the universal automatic test system is clicked to start an automatic test.

(S3) The light source of the image acquisition unit is turned on via the control and processing module (computer). The image is acquired by the camera of the image acquisition unit.

(S4) The image is processed. A key feature of the image is extracted. The type of the digital plugboard is determined.

(S5) A DC power and the test signal needed by the digital plugboard are generated by the power supply and the signal generator of the test instrument module.

(S6) The output signal from the test port output by the digital plugboard is collected by the signal collector.

(S7) The output signal is analyzed by the control and processing module (computer). Whether the output signal has a preset signal amplitude and signal pattern is determined. If there are multiple unqualified output signals, a transmission link of each of the unqualified output signals and a corresponding test point thereof are sequentially extracted from the database.

(S8) Test points of the transmission link of the unqualified output signals are sequentially collected by the detection probe. The unqualified output signals are analyzed by the control and processing module (computer). Whether the unqualified output signals satisfies a requirement is determined according to the signal amplitude and signal pattern. A fault point is located. Specifically, the transmission link of each signal and the test point of the transmission link are preset by the universal automatic test system. When the universal automatic test system determines that a signal is different from the standard signal, the universal automatic test system calls the detection probe to test each test point of the transmission link, and collect and determine each test point, so as to determine the most possible fault position. The transmission link may have multiple fault points. Since each test point will affect a signal of a next test point, thus only the fault point which is closest to the test signal is determined. After the test point is repaired, subsequent test points will be determined.

In summary, the universal automatic test system provided herein can determine a type of the digital plugboard and a point to be test based on the image of the digital plugboard, and call a corresponding automatic test program to complete the test of each point. A type of the test signal and output signal can be obtained through the universal automatic test system. By moving the detection probe, the any position of the digital plugboard can be test, and a fault portion of the digital plugboard can be obtained according to the test result, assisting users to maintain, which is worth to be promoted.

Described above are only some embodiments of the present disclosure, which are not intended to limit the disclosure. It should be understood that any variations, modifications, replacements and improvements made by those of ordinary skilled in the art without departing from the spirit of the disclosure shall fall within the scope of the disclosure defined by the appended claims.

What is claimed is:

1. A universal automatic test system for a digital plugboard based on imagine processing, comprising:
    a digital plugboard test platform;
    an image acquisition and processing module;
    a test instrument module; and
    a control and processing module;
    wherein the digital plugboard test platform is configured to fix a digital plugboard and link the digital plugboard to a task, and connect an external port of the digital plugboard to the test instrument module to allow the digital plugboard to generate an output signal according to a test signal;
    the image acquisition and processing module is configured to acquire an image of the digital plugboard and extract a layout feature of a chip and component of the digital plugboard, compare the layout feature with a feature data stored in a database, identify a type of the digital plugboard, and output an identification result to the control and processing module;
    the test instrument module is configured to generate the test signal under control of the control and processing module, collect the output signal from the digital plugboard, and transmit the test signal and the output signal to the control and processing module;
    the control and processing module is configured to control a test for the digital plugboard, determine whether the digital plugboard is in normal state or in fault state, and provide a fault portion and a maintenance plan;
    the digital plugboard test platform comprises a three-dimensional (3D) screw rod module, a control box, a platform, a signal transfer unit, a fixing clamp and a detection probe; the 3D screw rod module is configured to drive the detection probe to move in an X-axis direction, a Y-axis direction and a Z-axis direction to enable the detection probe to contact with any position of the digital plugboard; the control box is configured to drive the 3D screw rod module to move under control of the control and processing module; the fixing clamp is arranged at the platform; a size of the fixing clamp is capable of being adjusted according to a size of the digital plugboard to fix the digital plugboard; an end of the detection probe is capable of connecting to a test point of the digital plugboard; the other end of the detection probe is connected to the test instrument module; the signal transfer unit is a test port, and is arranged at the platform; an end of the test port is communicatively connected to the external port of the digital plugboard; and the other end of the test port is communicatively connected to the test instrument module;
    the image acquisition and processing module comprises an image acquisition unit, an image processing unit, a feature extraction unit and a determining unit sequentially connected; the image acquisition unit is configured to acquire the image of the digital plugboard; the image processing unit is configured to preprocess the image of the digital plugboard; the feature extraction unit is configured to extract the layout feature of the chip and component of the digital plugboard and compare with the feature data stored in the database to obtain a feature parameter of the digital plugboard; and the determining unit is configured to compare the feature parameter of the digital plugboard with the feature data stored in the database to determine the type of the digital plugboard;

the image acquisition unit comprises a camera and a light source; the light source is configured to allow the digital plugboard in a well-lit environment; and the camera is configured to acquire the image of the digital plugboard and transmit the image of the digital plugboard to the image processing unit;

the test instrument module comprises a power supply, a signal generator and a signal collector; the power supply is configured to provide a power signal for the digital plugboard; the signal generator is configured to provide the test signal for the digital plugboard; and the signal collector is configured to collect the output signal of the digital plugboard through the detection probe and the test port, and transmit the output signal to the control and processing module; and the universal automatic test system is configured to test the digital plugboard through steps comprising:

(S1) connecting the digital plugboard to the test port; determining whether the test port matches the digital plugboard; and if not, adapting, by an adapter, the digital plugboard and the test port;

(S2) starting an automatic test by clicking a start button on the universal automatic test system;

(S3) turning on, the light source of the image acquisition unit under control of the control and processing module; and acquiring, by the camera of the image acquisition unit, the image;

(S4) processing the image; extracting a key feature of the image; and determining the type of the digital plugboard;

(S5) generating, by the power supply and the signal generator of the test instrument module, a direct current (DC) power and the test signal needed by the digital plugboard;

(S6) collecting, by the signal collector, the output signal from the test port output by the digital plugboard;

(S7) analyzing, by the control and processing module, the output signal; determining whether the output signal has a preset signal amplitude and signal pattern; and if there are a plurality of unqualified output signals, sequentially extracting a transmission link of each of the plurality of unqualified output signals and a corresponding test point thereof from the database; and (S8) sequentially collecting, by the detection probe, the test point of the transmission link of each of the plurality of unqualified output signals; analyzing, by the control and processing module, the plurality of unqualified output signals; determining whether the plurality of unqualified output signals satisfies a preset signal amplitude and signal pattern; and locating a fault point, wherein the control and processing module comprises a test control unit, a determining unit and a human-machine interaction unit sequentially connected; the test control unit is configured to control a movement of the detection probe, allow a test instrument to generate the test signal and to acquire the output signal of the digital plugboard, and receive the identification result; the determining unit is configured to determine a state of the test instrument according to an output data of the universal automatic test system, and determine whether the digital plugboard is in normal state or in fault state according to a collected data of the test instrument; if in fault state, the determining unit is configured to evaluate the fault portion according to a data of each portion, and provide the maintenance plan; and the human-machine interaction unit is configured to control the universal automatic test system and output a test result, control the universal automatic test system to be on or off, and output or print the test result.

* * * * *